United States Patent
Hayashi

(10) Patent No.: US 9,997,653 B2
(45) Date of Patent: Jun. 12, 2018

(54) BACK-CONTACT SOLAR CELL AND METHOD FOR MANUFACTURING THE SAME

(71) Applicant: E I DU PONT DE NEMOURS AND COMPANY, Wilmington, DE (US)

(72) Inventor: Isao Hayashi, Kanagawa (JP)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days. days.

(21) Appl. No.: 15/291,642

(22) Filed: Oct. 12, 2016

(65) Prior Publication Data

US 2017/0104115 A1    Apr. 13, 2017

Related U.S. Application Data

(60) Provisional application No. 62/240,392, filed on Oct. 12, 2016.

(51) Int. Cl.
| | | |
|---|---|---|
| H01L 21/20 | (2006.01) | |
| H01L 21/4763 | (2006.01) | |
| H01L 31/0224 | (2006.01) | |
| B05D 3/00 | (2006.01) | |
| H01L 31/0216 | (2014.01) | |
| H01L 31/0236 | (2006.01) | |
| H01L 31/068 | (2012.01) | |
| H01L 31/18 | (2006.01) | |
| H01B 1/16 | (2006.01) | |
| H01L 31/0352 | (2006.01) | |

(52) U.S. Cl.
CPC ...... *H01L 31/022441* (2013.01); *B05D 3/007* (2013.01); *H01B 1/16* (2013.01); *H01L 31/02168* (2013.01); *H01L 31/02363* (2013.01); *H01L 31/03529* (2013.01); *H01L 31/0682* (2013.01); *H01L 31/1804* (2013.01); *H01L 31/1864* (2013.01); *H01L 31/1868* (2013.01); *B05D 2203/30* (2013.01); *B05D 2601/28* (2013.01)

(58) Field of Classification Search
CPC ......... H01L 31/022441; H01L 31/0682; H01L 31/022425; H01L 31/0516; H01L 31/02167
See application file for complete search history.

(56) References Cited

U.S. PATENT DOCUMENTS

2008/0230119 A1*  9/2008  Akimoto ............... C03C 8/04
                                                        136/255
2010/0258182 A1   10/2010  Akimoto
(Continued)

OTHER PUBLICATIONS

International Search Report and Written Opinion dated Jan. 12, 2017 for International Application No. PCT/US2016/056615.

*Primary Examiner* — Hsien Ming Lee

(57) ABSTRACT

A method for manufacturing a back-contact solar cell, comprising the steps of: (i) preparing a semiconductor substrate comprising an n-layer and a p-layer at the back side of the semiconductor substrate; (ii) applying a conductive paste on both the n-layer and the p-layer, wherein the conductive paste comprises a silver (Ag) powder, a palladium (Pd) powder, an additional metal powder selected from the group consisting of molybdenum (Mo), boron (B) and a mixture thereof, a glass frit, and an organic medium; and (iii) firing the applied conductive paste.

10 Claims, 5 Drawing Sheets

(56) References Cited

U.S. PATENT DOCUMENTS

2013/0032256 A1   3/2013  Lee et al.
2015/0007874 A1   1/2015  Hayashi
2016/0049532 A1*  2/2016  Sakai ..................... H01B 1/22
                                                                     136/256

* cited by examiner

BACK-CONTACT SOLAR CELL AND METHOD FOR MANUFACTURING THE SAME

FIELD OF THE INVENTION

The present invention relates to a back contact solar cell, more particularly to an electrode thereof.

TECHNICAL BACKGROUND OF THE INVENTION

An electrode of a back contact solar cell is required to have low electrical resistance on both a p-layer and an n-layer.

US2010258182 discloses a back contact solar cell having an electrode on both a p-layer and an n-layer. The electrode is formed of a conductive paste containing (a) a conductive powder containing Ag powders, Ti particles, or $TiH_2$ particles, as well as (i) metal particles selected from the group consisting of Zr, Cr, Co, Mo, Tc, Ru, Rh, Pd, W, Re, Os, Ir and Pt, (ii) alloy particles including said metals, or (iii) support particles supporting said metal particles, (b) glass frit, and (c) a resin binder.

SUMMARY OF THE INVENTION

An objective is to provide a back contact solar cell with an electrode having a sufficient electrical property on both an n-layer and a p-layer.

An aspect relates to a method for manufacturing a back-contact solar cell, comprising the steps of: (i) preparing a semiconductor substrate comprising an n-layer and a p-layer at the back side of the semiconductor substrate; (ii) applying a conductive paste on both the n-layer and the p-layer, wherein the conductive paste comprises a silver (Ag) powder, a palladium (Pd) powder, an additional metal powder selected from the group consisting of molybdenum (Mo), boron (B) and a mixture thereof, a glass frit, and an organic medium; and (iii) firing the applied conductive paste.

Another aspect relates to a back contact solar cell comprising an electrode, wherein the electrode comprises silver, palladium and an additional metal selected from the group consisting of molybdenum (Mo), boron (B) and a mixture thereof, and a glass.

A back contact solar cell with an electrode having a sufficient electrical property can be provided by the present invention.

DETAILED DESCRIPTION OF THE INVENTION

Figure 1:
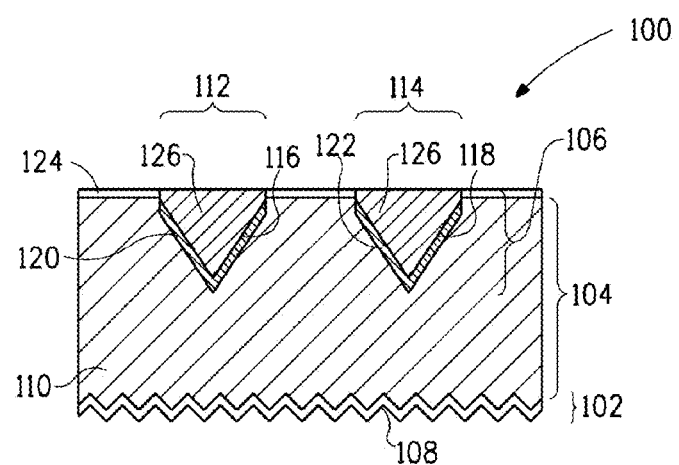
FIG. 1 is a cross-sectional schematic drawing of a back contact solar cell.

An example of the back contact solar cell 100 comprises a light receiving section 102, a carrier generating section 104 and an electrode section 106 as shown in FIG. 1. The light receiving section 102 has a textured structure and the surface thereof is covered with an anti-reflective film 108. The anti-reflective film 108 is a thin film composed of, for example titanium dioxide ($TiO_2$) and silicon dioxide ($SiO_2$). As a result of the light receiving section 102 having a textured structure covered by the anti-reflective film 108, more sun light enters the carrier generating section 104, thereby power generation of the back contact solar cell 100 could increase.

The carrier generating section 104 is a semiconductor 110. When light enters the semiconductor 110 from the light receiving section 102, valence band electrons are excited to the conduction band, free electrons are generated in the conduction band, and free holes are generated in the valence band. These free electrons and free holes are referred to as carriers.

If these carriers diffuse to reach the electrode section 106 prior to recombination in the carrier generating section 104, a current can be obtained from the electrode section 106. Thus, in order to increase conversion efficiency of the solar cell 100, it is preferable to use a semiconductor that impairs carrier recombination. For this reason, the semiconductor 110 used in the carrier generating section 104 is, for example, a crystal silicon wafer.

The electrode section 106 is a section where current generated in the carrier generating section 104 is obtained. This electrode section 106 is formed on the opposite side of the light receiving section 102 of the solar cell 100. The electrode section 106 has an anode 112 and a cathode 114. The anode 112 and the cathode can be alternately formed on the back side of the semiconductor 110 in an embodiment.

The anode 112 and the cathode 114 are respectively formed in the form of V grooves 116 and 118 that has triangular cross-section. The p-layer 120 is formed in the V groove 116 of the anode 112 and the n-layer 122 is formed in the V groove 118 of the cathode 114. The surface of the opposite side of the light receiving section 102 is covered with an oxide film 124. In addition, electrodes 126 are embedded in the V grooves 116 and 118. The electrode comprises silver, palladium and an additional metal selected from the group consisting of molybdenum (Mo), boron (B) and a mixture thereof, and a glass.

Method of Manufacture of Back Contact Solar Cell

The method of manufacturing a back-contact solar cell comprises the steps of (i) preparing a semiconductor substrate comprising an n-layer and a p-layer at the back side of the semiconductor substrate; (ii) applying a conductive paste on both the n-layer and the p-layer; and (iii) firing the applied conductive paste.

Figure 2A:
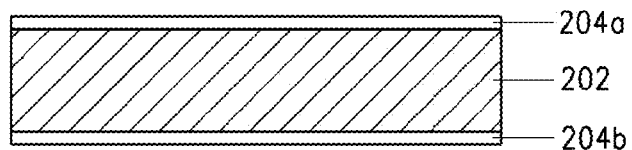
FIG. 2A to 2E are drawings for explaining a manufacturing process of a back contact solar cell.
Figure 2B:
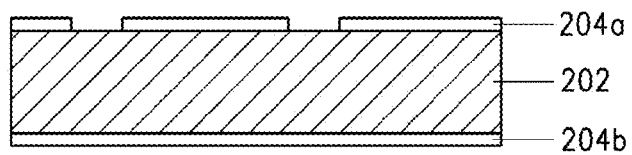
Figure 2C:
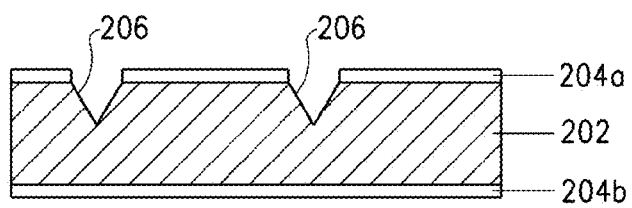

A semiconductor substrate 202 is prepared, and passivation layers 204a and 204b are formed on both sides thereof (FIG. 2A). The semiconductor substrate 202 can be a silicon wafer in an embodiment. The passivation layers 204a and 204b can be formed by, for example, thermal oxidation. The passivation layer 204a on one side of the semiconductor substrate is removed by photolithography or laser etching and so on to leave stripes of a predetermined pattern, for example width of 100 μm and interval of 300 μm (FIG. 2B). Anisotropic etching is carried out with potassium hydroxide (KOH) or tetramethyl ammonium hydroxide (TMAH) on the side from which a portion of the oxide film has been removed to form V grooves 206 in the form of stripes having a triangular cross-section (FIG. 2C).

Figure 2D:
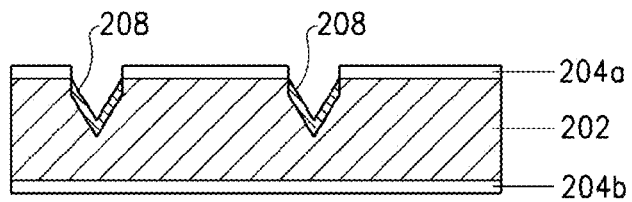
Figure 2E:
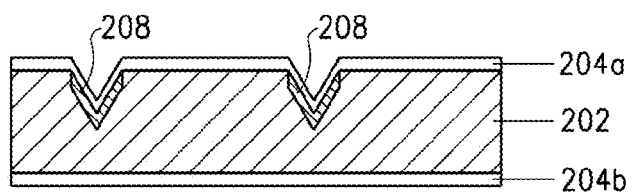

The substrate in which the V grooves 206 have been formed is placed in a diffusion furnace to diffuse phosphorous, thereby the n-layers 208 are formed at the V grooves (FIG. 2D). In the diffusion furnace, by interrupting the gas serving as the phosphorous material and introducing only oxygen, the surfaces of the V grooves 206 can be covered with an oxide film (FIG. 2E).

Figure 3A:
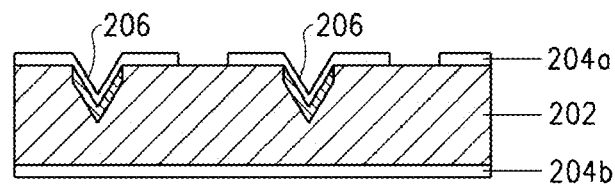
FIG. 3A to 3D are drawings for explaining a manufacturing process of a back contact solar cell.
Figure 3B:
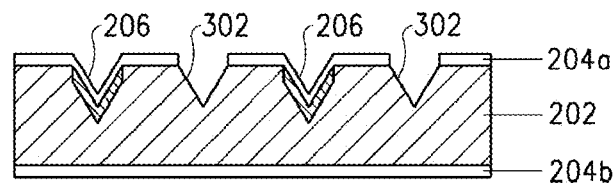

The passivation layer 204 is then partially removed from the substrate at certain intervals between the V grooves 206 (FIG. 3A) and new V grooves 302 are formed at the bare area where the passivation layer was removed (FIG. 3B) as described above.

Figure 3C:
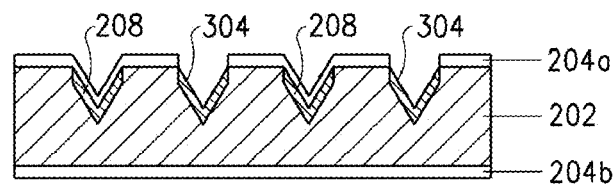
Figure 3D:
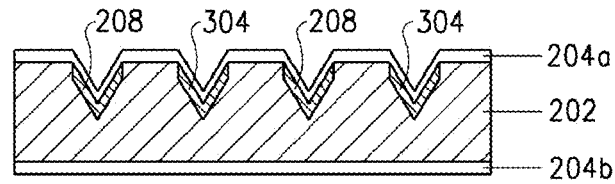

The substrate at which the V grooves 302 have been formed is placed in a diffusion furnace to diffuse boron, thereby p-layers 304 are formed on the silicon substrate 202 at the V grooves 302 (FIG. 3C). In the diffusion furnace, by interrupting the gas serving as the boron material and introducing oxygen only, the surfaces of the V grooves 302 can be covered with an oxide film (FIG. 3D).

Figure 4A:
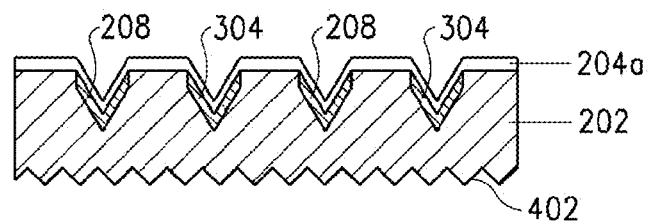
FIG. 4A to 4D are drawings for explaining a manufacturing process of a back contact solar cell.
Figure 4B:
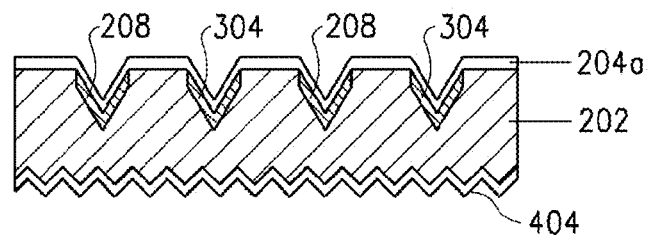

After removing the passivation layer 204b from the light receiving side, anisotropic etching is carried out with KOH or TMAH to form a textured structure 402 at the light receiving side (FIG. 4A). By then carrying out dry oxidation in a diffusion furnace, a passivation layer 404 is formed on the light receiving side (FIG. 4B).

Figure 4C:
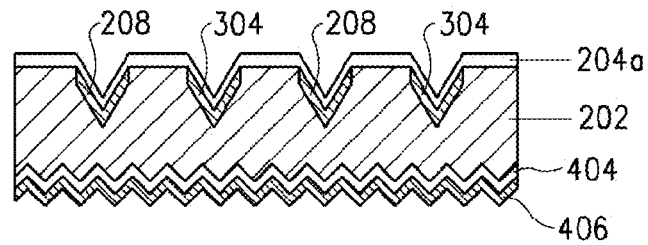

Subsequently, titanium dioxide ($TiO_2$), for example, is then deposited over the passivation layer 404 by sputtering to form a $TiO_2$ layer 406. As a result, an anti-reflective coating (ARC) consisting of the passivation layer 404 and the $TiO_2$ layer 406 is formed at the light receiving side (FIG. 4C).

Figure 4D:
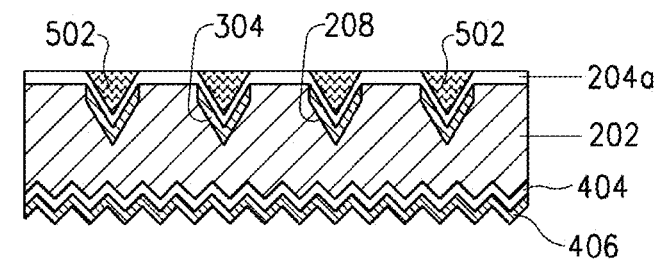

The conductive paste 502 is applied in the V grooves (FIG. 4D). The conductive paste 502 can be applied by a patterning method such as screen printing, stencil printing or dispensing in an embodiment. The applied paste 502 is then dried for 3 to 10 minutes under around 150° C. in an embodiment. The applied paste can go directly to the next firing step without the drying step in another embodiment.

The conductive paste 502 is fired at a temperature, for example 450 to 950° C. form the electrodes. During firing, the conductive paste penetrates the passivation layer 204a to reach the n-layers 208 and the p-layers 304 respectively in an embodiment. Openings can be made in the passivation layer 204a in advance of applying the conductive paste, for example by laser ablation in another embodiment.

Method for manufacturing solar cells is not limited to the above embodiment with reference to the figures. The present invention is applicable for various types of solar cell structures and methods. For example, the present invention can be applied for solar cells without a groove.

Conductive Paste

The conductive paste comprises a silver (Ag) powder; a palladium (Pd) powder; an additional metal powder selected from the group consisting of molybdenum (Mo), boron (B) and a mixture thereof; a glass frit; and an organic medium.

Silver Powder

The silver (Ag) powder is an electrically conductive metal powder. The Ag powder can be flaky, spherical, undefined or a mixture thereof in an embodiment. The particle diameter ($d_{50}$) of the Ag powder is 0.1 to 10 pm in an embodiment, 0.3 to 6 µm in another embodiment, 0.8 to 5 µm in another embodiment, 1 to 4 µm in another embodiment, and 1.5 to 3.5 µm in still another embodiment. The particle diameter ($D_{50}$) is obtained by measuring the distribution of the particle diameters by using a laser diffraction scattering method and can be defined as $D_{50}$ in an embodiment. Microtrac model X-100 is an example of the commercially-available devices.

Purity of the Ag powder can be 80% or higher in an embodiment, 90% or higher in another embodiment, 97% or higher in another embodiment.

The Ag powder can be 11 to 80 wt. % in an embodiment, 25 to 70 wt. % in another embodiment, 32 to 55 wt. % in another embodiment, 40 to 50 wt. % in still another embodiment, based on the weight of the conductive paste.

The Ag powder can be 20 to 94 wt. % in an embodiment, 36 to 93 wt. % in another embodiment, 55 to 91 wt. % in another embodiment, and 82 to 90 wt. % in still another embodiment, based on the weight of solid in the conductive paste. The solid in the conductive paste comprise at least the Ag powder, the palladium powder, the additional metal powder and the glass frit.

Palladium Powder

The palladium (Pd) powder is a metal powder comprising at least Pd. The Pd powder can be flaky, spherical, undefined or a mixture thereof in an embodiment. The particle diameter ($d_{50}$) of the Pd powder is 0.1 to 10 µm in an embodiment, 0.5 to 6.5 µm in another embodiment, 1 to 3 µm in another embodiment.

The Pd powder can be a Pd element powder, a Pd alloy powder or a mixture thereof in an embodiment. The Pd powder comprises Pd at least 30 wt. % in an embodiment, at least 65 wt. % in another embodiment, at least 90 wt. % in another embodiment based on the weight of the Pd powder.

The Pd powder can be 0.1 to 20 wt. % in an embodiment, 0.4 to 16 wt. % in another embodiment, 0.6 to 12 wt. % in another embodiment, 0.8 to 8 wt. % in another embodiment, and 1 to 3 wt. % in still another embodiment, based on the weight of the conductive paste.

The Pd powder can be 0.7 to 30 wt. % in an embodiment, 1 to 15 wt. % in another embodiment, 1.5 to 8 wt. % in another embodiment, and 2 to 3.5 wt. % in still another embodiment, based on the weight of solid in the conductive paste.

The Pd powder can be 0.5 to 100 parts by weight in an embodiment, 1 to 30 parts by weight in another embodiment, 1.5 to 12 parts by weight in still another embodiment, and 2 to 8 parts by weight in still another embodiment, as the Ag powder is 100 parts by weight.

Additional Metal Powder

The additional metal powder essentially comprises a powder of metal element other than silver and palladium. The additional metal is selected from the group consisting of molybdenum (Mo), boron (B) and a mixture thereof. The electrical property of the back contact solar cell improves when the electrode is formed with the conductive paste containing the additional metal powder as shown in Example below.

The additional metal powder can be flaky, spherical, irregularly-shaped or a mixture thereof in an embodiment. The particle diameter ($D_{50}$) of the additional metal powder is 0.1 to 10 µm in an embodiment, 0.3 to 5 µm in another embodiment, 0.8 to 3 µm in another embodiment.

The additional metal powder can be a metal element powder, an alloy powder or a mixture thereof in an embodiment. The alloy powder of additional metal comprises at least Mo, B or both thereof in another embodiment. The alloy powder of additional metal comprises the additional metal at least 50 wt. % in an embodiment, at least 70 wt. % in another embodiment, at least 90 wt. % in another embodiment based on the weight of the additional metal powder. The alloy powder of additional metal comprises the additional metal 99 wt. % or lower in an embodiment, 90 wt. % or lower in another embodiment, 80 wt. % or lower in another embodiment, based on the weight of the additional metal powder.

The additional metal powder can be 0.1 to 10 wt. % in an embodiment, 0.5 to 3.5 wt. % in another embodiment, 0.8 to 2.5 wt. % in another embodiment, 1 to 2 wt. % in still another embodiment, based on the weight of the paste.

The additional metal powder can be 0.8 to 15 wt. % in an embodiment, 1.5 to 5 wt. % in another embodiment, and 2 to 3.5 wt. % in still another embodiment, based on the weight of solid in the conductive paste. The additional metal powder can be 0.5 to 90 parts by weight in an embodiment, 0.7 to 50 parts by weight in another embodiment, 0.8 to 20 parts by weight in another embodiment, 1 to 8 parts by weight in another embodiment, 1.5 to 6 parts by weight in still another embodiment, and 2 to 4 parts by weight in still another embodiment, as the Ag powder is 100 parts by weight.

Weight ratio of the Pd powder to the additional metal powder (Pd powder : Additional metal powder) can be 1:0.01 to 1:10 in an embodiment, 1:0.05 to 1:7 in another embodiment, 1:0.08 to 1:5 in another embodiment, 1:0.1 to 1:3 in another embodiment, 1:0.2 to 1:2 in still another embodiment.

Glass Frit

The glass frit melts during firing to adhere to the substrate. Particle diameter of the glass frit can be 0.05 to 5 µm in an embodiment, 0.1 to 3.5 µm in another embodiment, 0.5 to 1.5 µm in another embodiment. Softening point of the glass frit can be 390 to 600° C. in an embodiment, 400 to 550° C. in another embodiment, 410 to 460° C. in another embodiment. When the softening point is in the range, glass frit can melt properly to obtain the effects mentioned above. The softening point of a glass frit can be obtained by the fiber elongation method of ASTM C338-57.

The chemical composition of the glass frit here is not limited. Any glass frit suitable for use in electrically conducting pastes is available. The glass frit can comprise a lead silicate (Pb—Si) glass, a lead boron silicate (Pb—B—Si) glass, a lead tellurium (Pb—Te) glass, a lead-free bismuth (Bi) glass, a lead-free zinc borosilicate (Zn—B—Si) glass or a mixture thereof in an embodiment. The lead containing glass frit could be excellent from a viewpoint of both softening point and glass fusion characteristics in an embodiment. The lead-free glass frit could be excellent from a viewpoint of environmental-friendly in an embodiment. The glass frit comprises Pb—B—Si glass, Pb—Si—Al glass, Pb—Te—B glass, Pb—Te—Li glass, Pb—V glass, Bi—Si—B glass, Bi—Te glass or a mixture thereof in another embodiment.

The glass frit can be 1 to 40 wt. % in an embodiment, 1.8 to 32 wt. % in another embodiment, 2.5 to 18 wt. % in another embodiment, 3 to 9 wt. % in still another embodiment, based on the weight of the conductive paste.

The glass frit can be 4 to 75 wt. % in an embodiment, 5 to 62 wt. % in another embodiment, 6 to 42 wt. % in another embodiment, 6 to 31 wt. % in another embodiment, and 7 to 17 wt. % in still another embodiment, based on the weight of solid in the conductive paste.

The glass frit can be 6 to 300 parts by weight in an embodiment, 6.5 to 200 parts by weight in another embodiment, 6.8 to 100 parts by weight in another embodiment, 7 to 100 parts by weight in another embodiment, 7.5 to 50 parts by weight in another embodiment, 8 to 20 parts by weight in another embodiment, 8.5 to 15 parts by weight in another embodiment, and 9.5 to 13 parts by weight in still another embodiment, as the Ag powder is 100 parts by weight.

Organic Medium

The organic medium is an organic resin or a mixture of an organic resin and a solvent. Organic medium can be, for example, a pine oil solution, an ethylene glycol monobutyl ether monoacetate solution of polymethacrylate, an ethylene glycol monobutyl ether monoacetate solution of ethyl cellulose, a terpineol solution of ethyl cellulose or a texanol solution of ethyl cellulose in an embodiment. The organic medium can be a terpineol solution of ethyl cellulose in another embodiment. The organic resin is 5 wt % to 50 wt % based on the weight of the organic medium in an embodiment.

The organic medium can be 10 to 60 wt. % in an embodiment, 15 to 57 wt. % in another embodiment, 22 to 53 wt. % in another embodiment, 35 to 50 wt. % in still another embodiment, based on the weight of the paste.

The organic medium can be 25 to 135 parts by weight in an embodiment, 55 to 129 parts by weight in another embodiment, and 80 to 121 parts by weight in still another embodiment, as the Ag powder is 100 parts by weight.

Additives

A thickener, a stabilizer and other typical additives can be added to the conductive paste. The additive can be determined dependent upon the characteristics of the ultimately required the conductive paste.

The conductive paste can be produced by mixing each of the above-mentioned components with a mixer such as a roll mixing mill and a rotary mixer. The solvent can be added to adjust the viscosity. The viscosity of the conductive paste is 50 to 350 Pa·s in an embodiment, 80 to 300 Pa·s in another embodiment, 95 to 220 Pa·s in another embodiment in the case of using a #14 spindle with a Brookfield HBT viscometer and measuring using a utility cup at 10 rpm at 25° C.

EXAMPLES

The present invention is illustrated by, but is not limited to, the following examples.

The conductive paste was prepared with the following materials. The amount of each material is shown in Table 1.

Silver powder: Flaky Ag powder with particle diameter (D50) of 2.7 µm.

Palladium powder: Spherical Pd powder with particle diameter (D50) of 2.0 µm.

Additional metal powder: Spherical bismuth (Bi) element powder with particle diameter (D50) of 1.5 µm, spherical molybdenum (Mo) element powder with particle diameter (D50) of 1.5 µm or spherical boron (B) element powder with particle diameter (D50) of 1.5 µm.

Glass frit: Lead borosilicate glass frit with particle diameter (D50) of 0.79 µm and softening point (Ts) of 437° C.

Organic medium: A terpineol solution of ethyl cellulose.

Additive: A rheology agent, a thixotropic agent and a surfactant respectively.

The materials were mixed to form a conductive paste. When well mixed, the conductive paste was repeatedly passed through a 3-roll mill for at progressively increasing pressures from 0 to 400 psi. The degree of dispersion was measured by fineness of grind (FOG). A typical FOG value was adjusted to 20/10 or less. Viscosity was 100-200 Pa·s measured at 25° C. by Brookfield HBT with a spindle #14 at 10 rpm.

Figure 5:
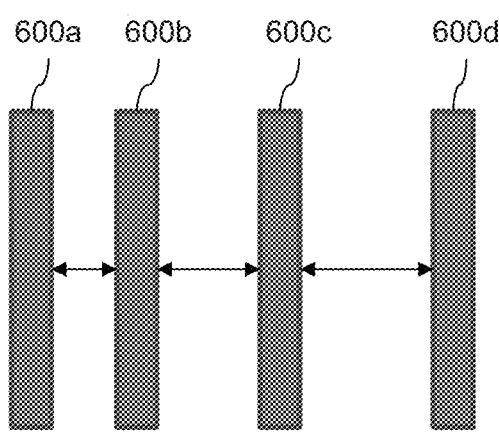
FIG. 5 is a drawing to explain the measuring method of Examples.

The conductive paste prepared above was screen printed on a N base silicon substrate (30 mm long×30 mm wide× 0.15 mm thick) having a p-layer and a P base silicon substrate having an n-layer respectively. The printed line pattern was shown in FIG. 5 where four lines 600a, 600b, 600c and 600d were formed with space of 1 mm between the lines 600a and 600b, 2 mm between the lines 600b and 600c, and 3 mm between the lines 600c and 600d.

The electrode was formed by drying the line patterns at 150° C. for 90 seconds followed by firing at setting temperature of 600° C. for 30 seconds in a an IR heating belt furnace. The electrodes were 1 mm wide and 10 mm long.

The contact resistance ($R_c$) was determined by using a TLM method. The following formula is available: $R=(L/W) \times R_{sh}+2R_c$ where W is width of electrodes, L is the space distance between two electrodes, $R_{sh}$ is sheet resistance of a Si substrate, and R is resistance between two electrodes. As is apparent from the mathematical formula above, the resistance R between the electrodes bears a linear relationship to the distance L between the electrodes. Accordingly, $2R_c$ is determined by measuring each resistance R at a space distance L between electrodes respectively. The sheet resistance $R_{sh}$ of the Si substrate is constant.

In this Example, the distance L between the two electrodes was plotted on the X-axis. The value of resistance R of the electrodes was measured by four-terminal method and plotted on the Y-axis at the distance $L_n$ on X-axis. This procedure was conducted with respect to other combinations of two arbitrary electrodes, and plotted. Y-intercept equal to $2R_c$ was determined by the least squares method and thereby the value of contact resistance $R_c$ at the contact interface between the electrodes and the silicon substrate was determined. The results are shown in Table 1.

The electrode had sufficiently low $R_c$ on both the n-layer and the p-layer in Example (Ex.) 1 and 2 where the conductive paste contained the Ag powder, the Pd powder and the Mo powder or the B powder. The electrode contained no additional metal powder and/or Pd powder had insufficiently high $R_c$ on the p-layer in Comparative Example (Com. Ex.) 1 to 5. The $R_c$ in Com. Ex. 3 to 5 were too high to measure on both the n-layer and the p-layer.

TABLE 1

| | | | | | | | (parts by weight) | | |
|---|---|---|---|---|---|---|---|---|---|
| | | Ex. 1 | Ex. 2 | Com. Ex. 1 | Com. Ex. 2 | Com. Ex. 3 | Com. Ex. 4 | Com. Ex. 5 |
| Composition | Ag powder | 100 | 100 | 100 | 100 | 100 | 100 | 100 |
| | Pd powder | 3 | 3 | 3 | 3 | 0 | 0 | 0 |
| | Mo powder | 3 | 0 | 0 | 0 | 3 | 0 | 0 |
| | B powder | 0 | 3 | 0 | 0 | 0 | 3 | 0 |
| | Bi powder | 0 | 0 | 3 | 0 | 0 | 0 | 3 |
| | Glass frit | 11 | 11 | 11 | 11 | 11 | 11 | 11 |
| | Organic medium | 109 | 109 | 109 | 109 | 109 | 109 | 109 |
| Rc | N layer (ohm) | 0.33 | 0.34 | 0.33 | 0.36 | —* | —* | —* |
| | P layer (ohm) | 0.52 | 0.49 | 0.77 | 0.74 | —* | —* | —* |

*Too high value to measure.

What is claimed is:

1. A method for manufacturing a back-contact solar cell, comprising the steps of:
    (i) preparing a semiconductor substrate comprising an n-layer and a p-layer at the back side of the semiconductor substrate;
    (ii) applying a conductive paste on both the n-layer and the p-layer, wherein the conductive paste comprises a silver (Ag) powder, a palladium (Pd) powder, an additional metal powder selected from the group consisting of molybdenum (Mo), boron (B) and a mixture thereof, a glass frit, and an organic medium; and
    (iii) firing the applied conductive paste.

2. The method of claim 1, wherein the semiconductor substrate is a crystal silicon wafer.

3. The method of claim 1, wherein the particle diameter of the silver powder is 0.1 to 10 μm.

4. The method of claim 1, wherein the particle diameter of the palladium powder is 0.1 to 10 μm.

5. The method of claim 1, wherein the particle diameter of the additional metal powder is 0.1 to 10 μm.

6. The method of claim 1, wherein the silver powder is 11 to 80 weight percent (wt. %), the palladium powder is 0.1 to 20 wt. %, the additional metal powder is 0.1 to 10 wt. %, the glass frit is 1 to 40 wt. %, and the organic medium is 10 to 60 wt. % based on the weight of the conductive paste.

7. The method of claim 1, wherein the silver powder is 20 to 94 weight percent (wt. %), the palladium powder is 0.7 to 30 wt. %, the additional metal powder is 0.8 to 15 wt. %, the glass frit is 4 to 75 wt. % based on the weight of solid in the conductive paste.

8. The method of claim 1, wherein the silver powder is 100 parts by weight, the palladium powder is 0.5 to 100 parts by weight, the additional metal powder is 0.5 to 90 parts by weight, and the glass frit is 6 to 300 parts by weight.

9. The method of claim 1, wherein the firing temperature is at 450 to 950° C.

10. A back contact solar cell comprising an electrode, wherein the electrode comprises silver, palladium and an additional metal selected from the group consisting of molybdenum (Mo), boron (B) and a mixture thereof, and a glass.

* * * * *